Dec. 30, 1952 J. M. OLTHUIS ET AL 2,624,006

AUTOMATIC FREQUENCY CONTROL CIRCUIT

Filed Feb. 11, 1949

INVENTOR.
JAN MAXIMILIAAN OLTHUIS
EDUARD HERMAN HUGENHOLTZ
BY Fred M. Vogel
AGENT.

Patented Dec. 30, 1952

2,624,006

UNITED STATES PATENT OFFICE 2,624,006

AUTOMATIC FREQUENCY CONTROL CIRCUIT

Jan Maximiliaan Olthuis and Eduard Herman Hugenholtz, Eindhoven, Netherlands, assignors to Hartford National Bank and Trust Company, Hartford, Conn., as trustee Application February 11, 1949, Serial No. 75,804
In the Netherlands April 15, 1948

5 Claims. (Cl. 250—36)

Figure 1:
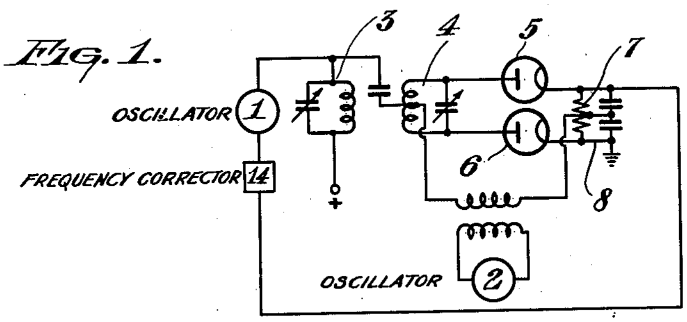

This invention relates to devices comprising an oscillator automatically corrected in frequency.

For automatic frequency correction of an oscillator it is known either to couple an electrical or mechanical frequency corrector, for example a reactance tube circuit, to the frequency-determining oscillatory circuit, or to connect a variable reactance to a movable control member governed by a control voltage (AFC voltage) bringing about automatic frequency correction.

The AFC-voltage may be developed in different ways.

If the oscillator frequency is required to be stabilised at a predetermined value, use is frequently made of a discriminator, tuned to the desired frequency, of the band-pass filter type commonly used for the detection of frequency-modulated oscillations (cf., for example, Terman, 1947 "Radio Engineering," page 523). The AFC-voltage is in this case obtained by mixing two voltages derived from the oscillator and having a frequency which, as a rule, corresponds to the oscillator frequency, said voltages exhibiting a phase-shift which varies with the oscillator frequency under the action of the properties of the band-pass filter. Instead of utilising a band-pass filter bringing about a phase-shift dependent on frequency, use may be made of other networks producing a similar effect, for example a high-pass filter and a low-pass filter.

Mixing the phase-shifted signals in, for example, a mixing stage comprising two diodes connected in push-pull provides an AFC-voltage of which the polarity and value characterize the polarity and value of the frequency difference between the oscillator frequency and the central frequency of the band-pass filter, which voltage may thus be used for obtaining an automatic decrease in said frequency difference.

However, such a so-called absolute frequency discriminator only provides a control voltage in the presence of a certain frequency deviation of the voltage supplied thereto with respect to the central frequency of the band-pass filter, so that such a discriminator does not allow of reducing frequency deviations to zero.

However, this is offset by the advantage that there is no objection to utilising a mechanical frequency corrector which possesses a certain inertia. In so far as frequency deviations occurring do not surpass the range of the tuned discriminator, the AFC-control invariably becomes active, in other words, with an AFC-circuit comprising an absolute discriminator the so-called catching region, that is to say the frequency range within which frequency correction automatically starts, corresponds to the useful range of the discriminator.

If the frequency of an oscillator is required to be synchronized to the frequency of an existing control oscillation, an AFC-voltage may be obtained by comparison of the oscillator voltage and the control oscillation and this in a very simple manner by mixing the signals to be synchronized. This kind of circuit belongs, contrary to the absolute discriminators described before, to the category of comparative discriminators and is usually referred to as beat discriminator.

Such a beat discriminator provides an AFC-direct voltage dependent on the polarity and value of the phase difference between the compared alternating voltages only in the case of synchronism of the said voltages, or otherwise an alternating voltage of difference frequency which, provided the alternating voltage reaches the frequency corrector substantially without attenuation and the latter is capable of following the pulsations of the alternating voltage, brings about frequency modulation of the oscillator voltage until permanent synchronism with the control oscillation occurs.

The maximum frequency difference that may be corrected automatically, starting from the non-stabilised position, in some cases briefly referred to as catching range, is thus limited by the time-constant of the control circuit comprising the frequency corrector. The synchronism once being obtained, subsists if, for example, the oscillator is slowly detuned until the control range of the frequency corrector is surpassed or, in other words, the so-called holding range of the AFC-circuit is surpassed. This holding range is frequently materially wider than the abovementioned catching range, while the realisation of a catching range sufficient for practical purposes is attended with appreciable inconveniences with regard to the dimensioning of the AFC-circuit.

According to the invention, a device for automatic frequency correction of an oscillator with respect to a control oscillation in which the advantages of the AFC-circuits having an absolute discriminator and a comparative discriminator are combined, is obtained in a simple manner by taking the AFC-voltage from a tuned discriminator comprising a mixing stage to which for the purpose of stabilising the oscillator frequency against the control oscillation this control oscilthe control oscillation this control oscillation is also supplied.

The band-pass filter discriminator and the beat discriminator provided in the device thus obtained substantially do not interfere with one another, at least if unduly strong coupling between the source of control oscillations and one of the circuits of the band-pass filter is avoided. The advantages of the two discriminator types occur in combination, one neutralizing the disadvantages of the other. The catching range of the device corresponds to the comparatively wide catching range of the AFC-circuit comprising the band-pass filter discriminator. When the frequency deviation to be corrected has been brought by the band-pass filter AFC-circuit within the catching range of the AFC-circuit comprising the beat discriminator, this results in synchronism of the oscillator voltage with the control oscillation and the band-pass filter AFC-circuit substantially no longer takes part in the production of the AFC-voltage in so far as the frequency of the control voltage corresponds only approximately to the central frequency of the band-pass filter.

Within the holding range of the beat discriminator AFC-circuit which substantially corresponds to the catching range of the band-pass filter AFC-circuit full advantage is taken of the high control sensitivity of the first-mentioned AFC-circuit. The dimensioning difficulties encountered with AFC-circuits used separately are now suppressed while the time-constant of the control circuit only plays an insubordinate part, so that the choice between the use of a mechanical or an electronic frequency corrector need primarily be dependent only on the purpose for which it is to be used.

Figure 2:
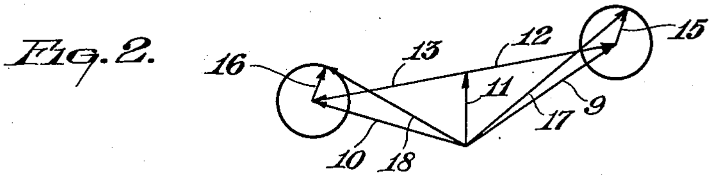
Figure 3:
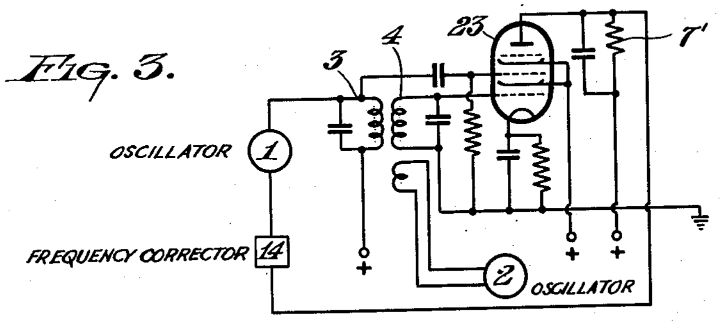
Figure 4:
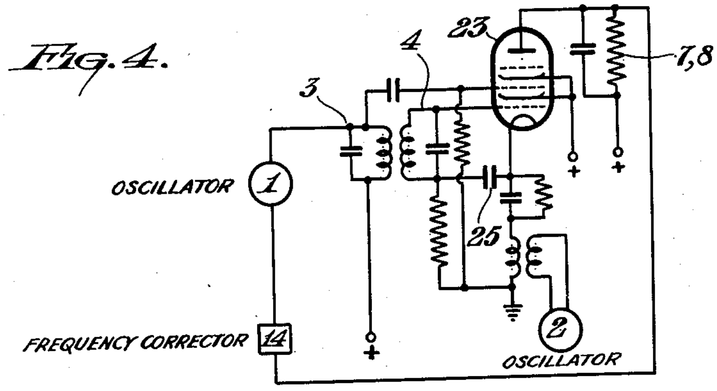

The invention will now be explained more fully by reference to the accompanying drawing, in which:

Figs. 1, 3 and 4 show detail circuits comprising differently constructed mixing stages of devices according to the invention, and Fig. 2 shows a vector diagram to explain the operation of the circuit shown in Fig. 1.

In Fig. 1, reference numeral 1 designates a high-frequency oscillator the frequency of which must be brought into synchronism with the frequency of a control voltage generated by an oscillator 2. The oscillations generated by the oscillator 1 are supplied to a band-pass filter discriminator comprising tuned circuits 3, 4 and two push-pull connected diodes 5, 6 connected to the second circuit and comprising output filters 7, 8. The voltage set up at the output filters is supplied to a frequency corrector 14, which is coupled to the oscillator and which may be constituted, for example, by a reactance tube circuit.

The circuit so far described is a circuit commonly used for AFC-control and comprising an obsolute frequency discriminator. The output voltage of the frequency discriminator is either positive or negative according as the oscillator frequency deviates in one direction or in another with respect to the central frequency of the band-pass filter.

The operation of such a band-pass filter discriminator and the production of the AFC-control voltage, which are known per se, will be explained more fully, for the sake of completeness, by reference to Fig. 2.

With a given deviation of the oscillator frequency with respect to the central frequency of the band-pass filter a voltage represented by vector 11 is set up across circuit 3 and voltages to be represented by vectors 12 and 13 are set up across the upper and lower halves of circuit 4. One diode 5 has supplied to it a voltage corresponding to vector 9 and produced by summation of vectors 11 and 12, the other diode 6 having supplied to it a voltage as represented by vector 10, corresponding to the sum of vectors 11 and 13. Direct voltages, obtained by rectification of the voltags 9 and 10 are set up at the output filters 7 and 8, said voltages corresponding to the peak values of the alternating voltages set up at the diodes. A control voltage suitable for automatic frequency correction thus appears at the output filters 7, 8 which are connected in series, the polarity and value of the said control voltage varying with the phase-shift between the voltage vectors 11 on the one hand and 12, 13 on the other hand. If, however, the voltage vectors 11 and 12, 13 are at right angles to one another, which is the case if the oscillator frequency corresponds to the central frequency of the band-pass filter, control voltage is not obtained.

So far no consideration has been given to the presence of the oscillator 2 which supplies a control voltage with equal phase to the diodes 5 and 6. In the diagram shown in Fig. 2, this control voltage may be represented by vectors 15 and 16, it having to be considered, however, that so long as there is no conformity between the frequencies of the oscillators 1 and 2, the vectors 15 and 16 turn with respect to the vectors 9 and 10, which is indicated by circles in the figure. So long as there is no synchronism between the oscillators 1 and 2, the vectors 15 and 16 yield an alternating voltage which is superposed on the direct output voltage and of which the frequency corresponds to the frequency difference between the voltages of the oscillators 1 and 2. The alternating voltage component thus presents in the AFC-voltage brings about frequency modulation of the voltage taken from the oscillator 1, in so far as the frequency corrector 14 is capable of following the pulsations of the difference frequency. If, however, this frequency modulation results in short-period synchronism between the oscillators 1 and 2, the band-pass filter discriminator in itself does not provide a control voltage, provided that the frequency of the control voltage exactly corresponds to the central frequency of the band-pass filter, the AFC-control being permanently taken over by the push-pull rectifying circuit which is now solely active as a beat discriminator. If the control voltage frequency differs from the central frequency of the band-pass filter, the band-pass filter discriminator circuit in itself provides a direct voltage which, however, is neutralized by an equal direct voltage of opposite polarity supplied by the beat discriminator circuit and thus has not disturbing effect.

A similarly operating circuit is obtained if the discriminator comprises two tuned circuits which are tuned to frequencies located on each side of the desired central frequency.

Such a circuit is shown in Fig. 3, in which parts identical with those of Fig. 1 are indicated by the same reference numerals. In this figure a mixing tube of the hexode type instead of a push-pull rectifier is used, voltages set up across the circuits 3 and 4 being supplied to the third and first control grid respectively of the mixing tube. The control voltage oscillator 2 is coupled to the circuit 4, as a result of which the control voltage is supplied to the first control grid of the mixing tube. Care must be taken that the control voltage appears across circuit 3 only with small amplitude, which may be ensured by sufficiently weak coupling between the circuits 3 and 4.

As in the circuit-arrangement shown in Fig. 1, an AFC-voltage supplied to a frequency corrector 14 coupled to the oscillator 1 is set up across the output circuit of the mixing arrangement, in this case across the output resistance 7' which is short-circuited with respect to high-frequency voltage. It should be considered that the said AFC-voltage is superposed on the average anode voltage of a mixing tube 23. Such is desirable in certain conditions, for example, if the AFC-voltage must be supplied to a positively-biased electrode of an oscillator of the reflex-klystron type. It is emphatically pointed out that, in order to attain synchronism between the oscillators 1 and 2 the AFC-circuit must be realised in such manner that AFC-direct voltages are supplied to the frequency corrector 14.

Fig. 4 shows a circuit similar to that of Fig. 3, but in which the control voltage supplied by the oscillator 2 is made active only in the circuit of a third control grid of the mixing tube 23 in that the lower end of the circuit 4 included in the circuit of the control grid is connected for high-frequency voltage by way of a coupling condenser 25 directly to the cathode of the mixing tube. Instead of being supplied to the first or third control grid, the control oscillation may be supplied to a further control electrode of the mixing tube, for example, to the suppressor grid, so that further decoupling may be obtained.

In the foregoing it has been taken for granted that the voltages supplied to the discriminator were taken directly from an oscillator 1 to be controlled and from a control-voltage oscillator 2, and that the central frequency of the band-pass filter discriminator was invariable. However, it is alternatively possible for the oscillator voltage and the control voltage, before being supplied to the discriminator, to be transposed in frequency by mixing the said voltages with voltages originating from further oscillators which may or may not be adjustable in frequency. Furthermore, the central frequency of the absolute discriminator, together with the frequency of the control voltage, may be made adjustable, in which event the synchronism between the frequency of the central band-pass filter and that of the control voltage need not fulfill unduly stringent requirements provided that the catching range of the beat discriminator provided in the device is of sufficient extensiveness.

Finally, it is observed that the control oscillation used may be a pulsatory voltage the fundamental frequency of which corresponds to a subharmonic of the tuning frequency of the tuned discriminator. Stabilisation of the oscillator voltage is then effected on a higher harmonic of the control oscillation, the choice of the stabilising higher harmonic frequency being determined by the tuned position of the discriminator.

What we claim is:

1. An automatic frequency control circuit arrangement, comprising first oscillator means for producing a first wave having frequency deviations about a given central frequency, voltage responsive frequency control means coupled to said first oscillator means, a tuned frequency discriminator circuit coupled to said first oscillator means and adapted to produce a first output control voltage having polarity and magnitude variations proportional to the frequency deviations of said first wave from said given central frequency, second oscillator means for producing a second wave having a frequency substantially equal to said given central frequency, means to apply said second wave to said tuned discriminator circuit to mix said first and second waves thereby to produce a second output control voltage having a frequency substantially equal to the difference in frequency between said first and second waves, and means to apply said first and second output control voltages to said voltage responsive frequency control means thereby to substantially suppress said frequency deviations of said first wave about said given central frequency.

2. An automatic frequency control circuit arrangement, comprising first oscillator means for producing a first wave having frequency deviations about a given central frequency, voltage responsive frequency control means coupled to said first oscillator means, a tuned frequency discriminator circuit comprising a band pass filter and a pair of rectifying elements coupled to said band pass filter in push-pull relationship, means to apply said first wave to said band pass filter thereby to produce a first output control voltage having polarity and magnitude variations proportional to the frequency deviations of said first wave from said given central frequency, second oscillator means for producing a second wave having a frequency substantially equal to said given central frequency, means to apply said second wave to said rectifying elements in in-phase relationship to mix said first and second waves thereby to produce a second output control voltage having a frequency substantially equal to the difference in frequency between said first and second waves, and means to apply said first and second output control voltages to said voltage responsive frequency control means thereby to substantially suppress said frequency deviations of said first wave about said given central frequency.

3. An automatic frequency control circuit arrangement, comprising first oscillator means for producing a first wave having frequency deviations about a given central frequency, voltage responsive frequency control means coupled to said first oscillator means, a tuned frequency discriminator circuit comprising a band pass filter including first and second coupled tuned circuits, an electron discharge tube having a cathode, output electrode, and first and second grid electrodes and means to couple each of said electrodes to a respective one of said tuned circuits, means to apply said first wave to one of said tuned circuits thereby to produce a first output control voltage having polarity and magnitude variations proportional to the frequency deviations of said first wave from said given central frequency, second oscillator means for producing a second wave having a frequency substantially equal to said given central frequency, means to apply said second wave solely to the other of said tuned circuits to mix said first and second waves thereby to produce a second output control voltage having a frequency substantially equal to the difference in frequency between said first and second waves, and means to apply said first and second output control voltages to said voltage responsive frequency control means thereby to substantially suppress said frequency deviations of said first wave about said given central frequency.

4. An automatic frequency control circuit arrangement, comprising first oscillator means for producing a first wave having frequency deviations about a given central frequency, voltage responsive frequency control means coupled to said first oscillator means, a tuned frequency discriminator circuit comprising a band pass filter including first and second coupled tuned circuits, an electron discharge tube having a cathode, output electrode, and first and second grid electrodes and means to couple each of said grid electrodes to a respective one of said tuned circuits, means to apply said first wave to one of said tuned circuits thereby to produce a first output control voltage having polarity and magniture variations proportional to the frequency deviations of said first wave from said given central frequency, second oscillator means for producing a second wave having a frequency substantially equal to said given central frequency, means to inject said second wave in the cathode circuit of said discharge tube to mix said first and second waves thereby to produce a second output control voltage having a frequency substantially equal to the difference in frequency between said first and second waves, and means to apply said first and second output control voltages to said voltage responsive frequency control means thereby to substantially suppress said frequency deviations of said first wave above said given central frequency.

5. An automatic frequency control circuit arrangement, comprising first oscillator means for producing a wave having frequency deviations about a given central frequency, voltage responsive frequency control means coupled to said first oscillator means, a tuned frequency discriminator circuit coupled to said first oscillator means and adapted to produce a first output control voltage having polarity and magnitude variations proportional to the frequency deviations of said wave from said given central frequency, second oscillator means for producing a pulsatory voltage having a fundamental frequency substantially equal to a subharmonic of said given central frequency, means to apply said pulsatory voltage to said tuned discriminator circuit to mix said wave and said pulsatory voltage thereby to produce a second output control voltage having a frequency substantially equal to the difference in frequency between said wave and a harmonic of the fundamental frequency of said pulsatory voltage, and means to apply said first and second output control voltages to said voltage responsive frequency control means thereby to substantially suppress said frequency deviations of said wave about said given central frequency.

JAN MAXIMILIAAN OLTHUIS.
EDUARD HERMAN HUGENHOLTZ.

REFERENCES CITED

The following references are of record in the file of this patent:

UNITED STATES PATENTS

| Number | Name | Date |
|---|---|---|
| 2,096,881 | Butler | Oct. 26, 1937 |
| 2,312,079 | Crosby | Feb. 23, 1943 |
| 2,332,540 | Travis | Oct. 26, 1943 |
| 2,406,309 | Zeigler et al. | Aug. 20, 1946 |
| 2,437,609 | Mayle | Mar. 9, 1948 |